US 6,707,552 B2
United States Patent
Gilmore et al.

(10) Patent No.: US 6,707,552 B2
(45) Date of Patent: Mar. 16, 2004

(54) HIGH PRECISION LASER BAR TEST FIXTURE

(75) Inventors: Steven S. Gilmore, West Bradford, PA (US); John Leiby, Reading, PA (US); John S. Rizzo, Oley, PA (US); Kenneth R. Weidner, Topton, PA (US)

(73) Assignee: Triquint Technology Holding Co., Hillsboro, OR (US)

( * ) Notice: Subject to any disclaimer, the term of this patent is extended or adjusted under 35 U.S.C. 154(b) by 530 days.

(21) Appl. No.: 09/739,199

(22) Filed: Dec. 18, 2000

(65) Prior Publication Data

US 2002/0126285 A1 Sep. 12, 2002

(51) Int. Cl.[7] ............................................... G01B 11/00
(52) U.S. Cl. ..................................... 356/400; 348/126
(58) Field of Search ......................... 348/126; 356/400, 356/237.5; 438/16

(56) References Cited

U.S. PATENT DOCUMENTS

| 5,331,406 A | * | 7/1994 | Fishbaine et al. | 356/621 |
| 5,547,537 A | * | 8/1996 | Reynolds et al. | 156/351 |
| 5,956,134 A | * | 9/1999 | Roy et al. | 356/237.5 |
| 6,036,196 A | | 3/2000 | Freund et al. | |
| 6,150,828 A | * | 11/2000 | Farnworth et al. | 324/758 |

FOREIGN PATENT DOCUMENTS

JP          2003148930          * 5/2003

* cited by examiner

Primary Examiner—Mark Tremblay
(74) Attorney, Agent, or Firm—Duane Morris LLP

(57) ABSTRACT

A test fixture for testing circuit components includes at least one test bar, at least one tray, a test pedestal, a transportable test stage, a pickup collet, a first camera, and a second camera. Each test bar contains at least one circuit component. Each tray contains at least one test bar. The test pedestal is adapted to hold at least one test bar. The transportable test stage includes at least one tray and the test pedestal. The transportable test stage transports the circuit component under test from the pickup collet to the test site and return. The trays and test pedestal are in a fixed position with respect to the test stage. The pickup collet picks up test bars from the trays and the test pedestal. The pickup collet also places the test bars in the trays and on the test pedestal. The first camera is used to visually align the pickup collet and components on the test stage, and read test bar identification codes. The second camera is used to visually align the test bars with a test site.

22 Claims, 6 Drawing Sheets

HIGH PRECISION LASER BAR TEST FIXTURE

FIELD OF THE INVENTION

The present invention is related to test fixtures, and particularly to test fixtures for testing optical devices such as laser diodes.

BACKGROUND OF THE INVENTION

To ensure high quality and high yield circuits, circuit components, such as optical devices (e.g., laser diodes and wavelength division multiplexers), are tested prior to bonding the devices to the circuit. For optical devices, this testing typically comprises measuring front light, rear light, and spectral performance of each device.

Previous test fixtures for performing these tests align and handle each device individually. The time required to align and handle each individual device often exceeds the actual time to test the device. Test fixtures typically move devices from one test station to another using stepper motors and transfer arms. Often the resolution of the stepper motors and the transfer arms is not sufficient to accurately align the device with the test equipment. Also, stepper motors and transfer arms often do not provide rotational alignment. Further, each stepper motors typically requires a large surface area. Thus, a need exists for a test fixture which is not required to handle each device individually and provides better positional resolution and rotational alignment, while utilizing a smaller surface area.

SUMMARY OF THE INVENTION

A test fixture for testing circuit components includes at least one test bar, at least one tray, a test pedestal, a transportable test stage, a pickup collet, a first camera, and a second camera. Each test bar is adapted to contain a plurality of circuit components. Each tray is adapted to contain a plurality of test bars. The test pedestal is adapted to hold at least one test bar. The transportable test stage includes at least one tray and the test pedestal. The tray(s) and test pedestal are in a fixed position with respect to the test stage. The pickup collet picks up and places the test bar(s). The first camera is used to visually align the pickup collet, and the second camera is used to visually align the test bar(s) with a test site.

BRIEF DESCRIPTION OF THE DRAWINGS

The invention is best understood from the following detailed description when read in connection with the accompanying drawing. The various features of the drawings may not be to scale. Included in the drawing are the following figures.

DETAILED DESCRIPTION

Figure 1A:
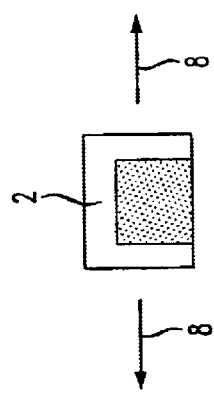
FIG. 1A is a diagram of an exemplary circuit component.
Figure 1B:
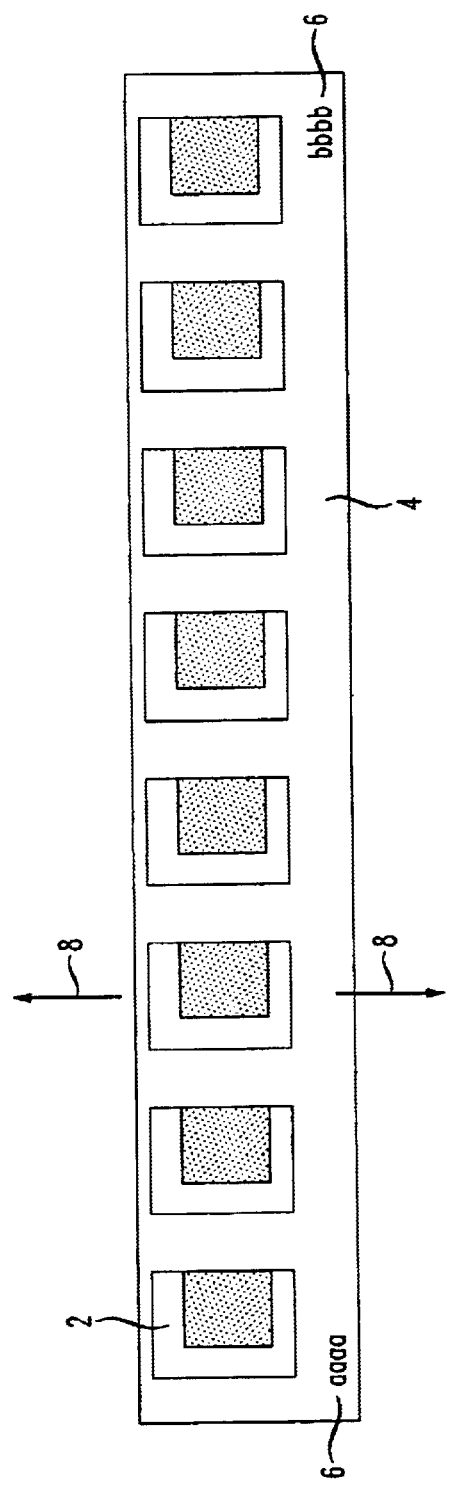
FIG. 1B is a diagram of a plurality of circuit components placed in a test bar, in accordance with the present invention.

FIG. 1A is a diagram of an exemplary circuit component 2, and FIG. 1B is a diagram of a plurality of circuit components 2 placed in a test bar 4, in accordance with the present invention. Circuit component 2 may be any circuit component, for example, an integrated circuit device, a bipolar circuit device, or an optical device. For explanatory purposes, circuit component 2 will be assumed to be a laser diode, although circuit component 2 may be any optical device, such as a laser diode or a wavelength division multiplexer. Prior to testing, test bar 4 is loaded with laser diodes 2. Test bar 4 also has identification codes 6 for identifying the specific laser diodes 2, placed in the test bar 4. The testing results of each laser diode 2 are recorded utilizing identification codes 6. Any number of laser diodes 2 may be placed in test bar 4. In an exemplary embodiment of the invention, as many as 32 laser diodes 2 are placed in each test bar 4.

Figure 4:
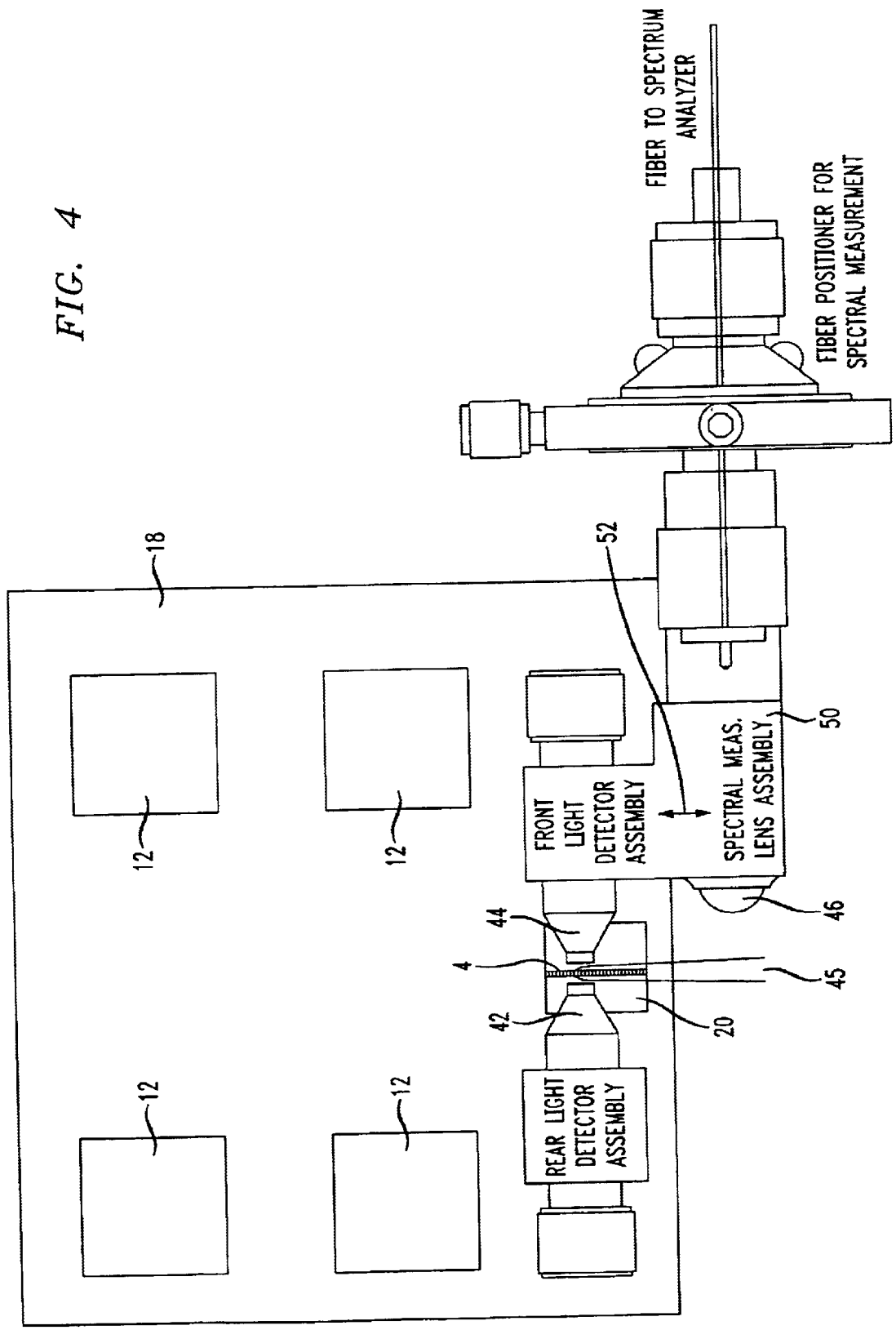
FIG. 4 is a top view of a test bar in alignment with a detector and lens mechanism in accordance with the present invention.

During testing, light is transmitted and reflected through each laser diode 2 in the directions indicated by arrows 8. Each laser diode 2 remains in test bar 4 during testing. Characteristics such as light intensity, light power, and spectral content are measured. Test detectors and probes are positioned at opposite sides of each laser diode 2 (One exemplary orientation of test bar 4 during testing is shown in FIG. 4). In an exemplary embodiment of the invention, each laser diode 2 in test bar 4 is tested in succession, until all laser diodes 2 in the test bar 4 are tested. In an alternate embodiment of the invention, a subset of the laser diodes in the test bar 4 are tested. In yet other embodiments of the invention, the testing order of the laser diodes 2 in the test bar 4 is differs.

Figure 2:
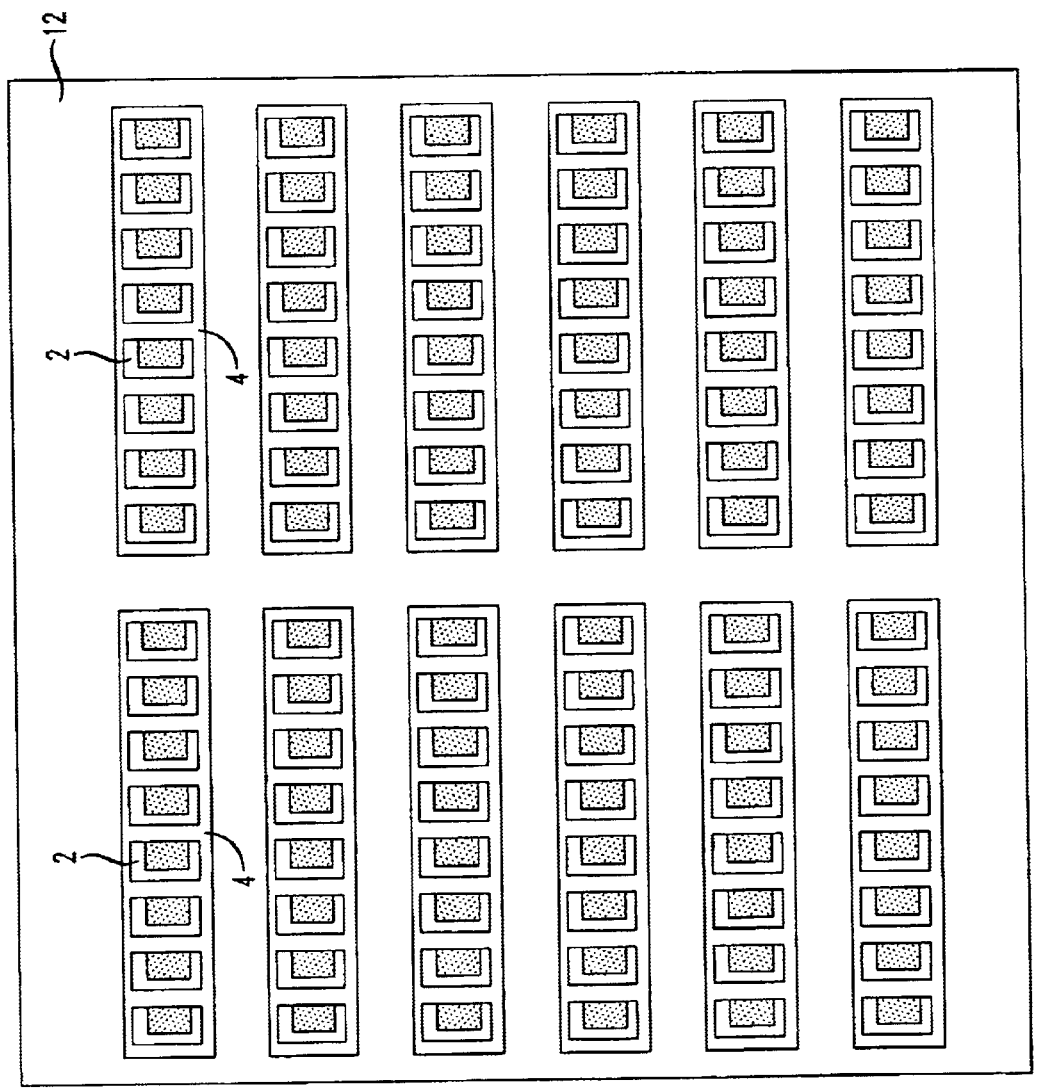
FIG. 2 is a top view of an exemplary tray in accordance with the present invention.

FIG. 2 is a top view of an exemplary tray in accordance with the present invention. Tray 12 contains a plurality of test bars 4. The orientation of test bars 4 shown in FIG. 2 is exemplary. Any number of test bars 4 may be contained in tray 12. In an exemplary embodiment of the invention, as many as 45 test bars 4 are contained in tray 12. Tray 12 is loaded with test bars 4 prior to testing.

Figure 3:
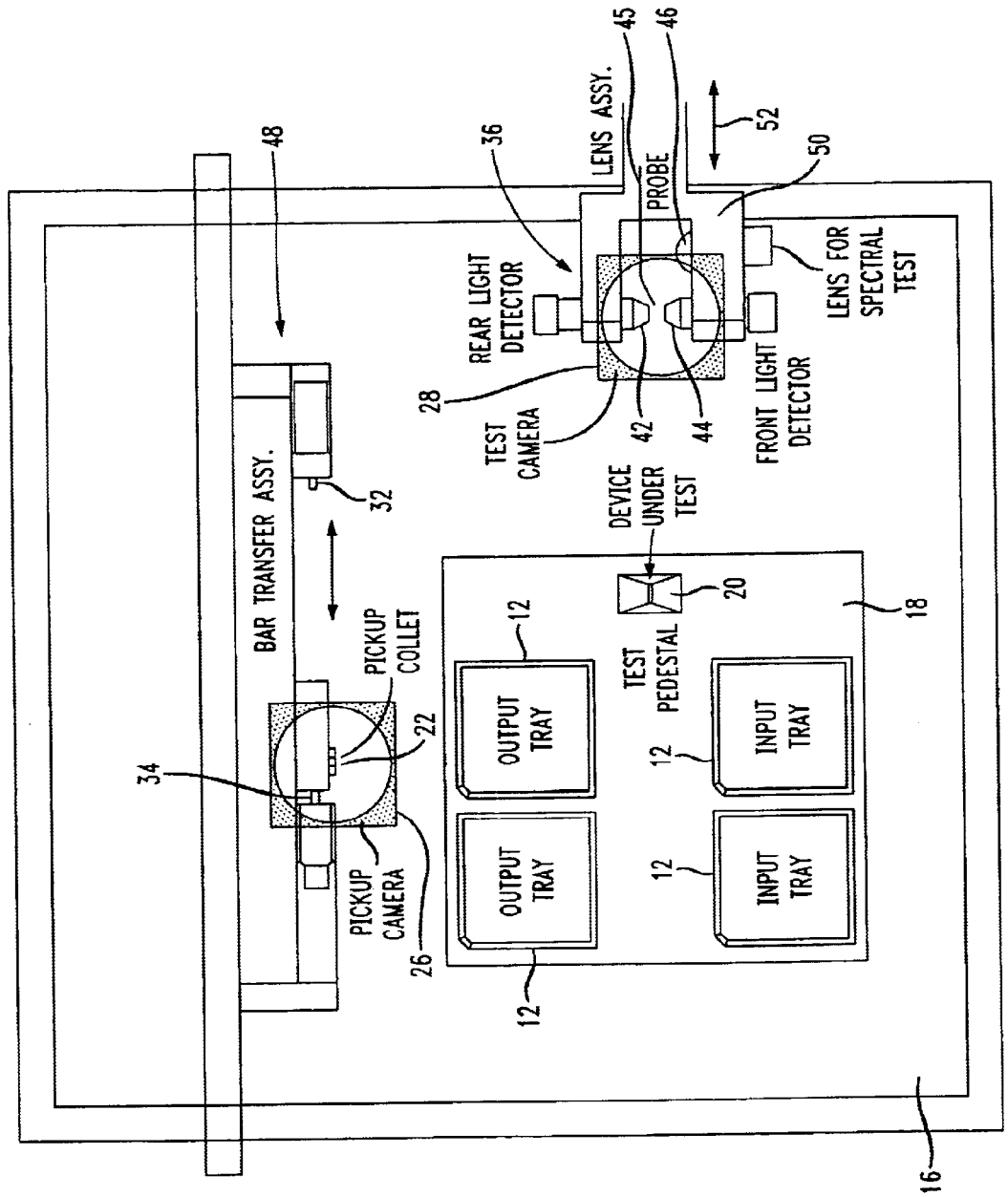
FIG. 3 is a top view of an exemplary text fixture in accordance with the present invention.

FIG. 3 is a top view of an exemplary text fixture in accordance with the present invention. The test fixture shown in FIG. 3, generally designated 30, comprises trays 12, transportable test stage 18, test table 16, test pedestal 20, pickup collet 22, pick up camera 26 (first camera), test camera 28 (second camera), and test site 36. Test stage 18 rides on a cushion of air provided by test table 16. Test stage 18 is transported to various positions on test table 16 by magnetically induced forces between the bottom surface of test stage 18 and the top surface of test table 16 (i.e., the surfaces of test stage 18 and test table 16 that face each other). Test stage 18 may be moved lineally in any direction in the plane of the surface of test table 16, and may also to rotationally positioned. This full range of motion of test stage 18 allows for precise alignment of test bars 4 and laser diodes 2 during testing. Suitable linear motors are commercially available from Northern Magnetics, Inc., and suitable rotary motors are commercially available from Industrial Devices Corp. A general-purpose computer (computer not shown in FIG. 3) controls positioning of test stage 18. Prior to testing, specific positional coordinates are programmed into the computer. These predetermined coordinates correspond to positions on test table 16 located under the pick up camera 26 and the test camera 28. Pick up camera 26 and test camera 28 are coupled to the general purpose computer, which is loaded with vision software. The vision software uses the images acquired by the cameras to precisely position objects within each camera's view. Pickup camera 26 and the general-purpose computer also interpret the identification codes 6 on test bars 4.

Transportable test stage 18 comprises at least one tray 12 and a test pedestal 20. The positioning of trays 12 and test pedestal 20 on test stage 18 as shown in test fixture 30 is exemplary. In test fixture 30, two trays are labeled input trays and two trays are labeled output trays. This labeling indicates that test bars 4 placed in the input trays will be tested. Test bars 4 that have been tested are placed in the output trays. The configuration of input trays and output trays as shown in test fixture 30 is exemplary. It is envisioned that test bars may be placed back in the same tray after testing. A test bar 4 to be tested, i.e., a selected test bar, is placed on test pedestal 20 by pickup collet 22. The top of test pedestal 20 is elevated above the upper surface of test stage 18. This allows for vertical alignment of the selected test bar on test pedestal 20 with the detectors and lens located at test site 36. In an exemplary embodiment of the invention, trays 12 are held in a fixed position with respect to test stage 18 by a vacuum, and a selected test bar is held in contact with test pedestal 20 by a vacuum. Also, test bars 4 may be held in position in trays 12 by a vacuum.

Pickup collet 22 manipulates test bars 4. In an exemplary embodiment, a test bar 4 is held in contact with pickup collet 22 by vacuum. Test bars 4 may also be held in contact with the pickup collet 22 by magnetic means or mechanical means. Pickup collet 22 picks up test bars from input trays, places test bars on test pedestal 20, picks up test bars from test pedestal 20, and places test bars in output trays. Pickup collet 22 is positioned between pickup camera 26 and test stage 18. Thus, when test stage 18 is moved under pickup camera 26, pickup collet 22 is positioned at location 32 on the bar transfer assembly 48. This allows pickup camera 26 to acquire an image of test stage 18 without pickup collet 22 obstructing the view. Prior to picking up or placing a test bar, pickup collet 22 is positioned to location 34 on the bar transfer assembly 48. In an exemplary embodiment of the invention, pickup collet is positioned pneumatically on bar transfer assembly 48. It is envisioned that pickup collet 22 may also be positioned, mechanically, magnetically, or by any other appropriate means.

Test site 36 comprises test detectors and probes for testing laser diodes 2. Test site 36 comprises a rear light detector 42, a front light detector 44, test probe 45, and a spectroscopic lens 46 for conducting spectral analysis. The selected test bar, which is placed on test pedestal 20 by pickup collet 22, is moved to test site 36 by test stage 18 being positioned under test camera 28. Test stage 18 is moved to the predetermined coordinates corresponding to test site 36. Once test stage 18 is positioned under test camera 28, the selected test bar on test pedestal 20 is aligned with rear light detector 42, front light detector 44, and test probe 45 by vision software via test camera 28. Each laser diode 2 comprises test pads (not shown). These test pads may be as small as approximately $2.5 \times 10^{-3}$ square inches. Test probe 45 makes contact with these pads to conduct testing.

To conduct a spectral test, spectroscopic lens 46 is aligned with the laser diode 2 being tested. This alignment is accomplished by the detector and lens mechanism 50, being moved in the directions indicated by arrow 52. Test stage 18 remains in a fixed location with respect to test table 16 while detector and lens mechanism 50 is being moved to accomplish this alignment.

In one embodiment of the invention, test pedestal 20 comprises a thermo-electric cooling device. This thermo-electric cooling device helps to maintain the selected test bar at an approximately constant temperature. Many commercially available thermo-electric cooling devices are suitable for are this purpose. Because test results may vary with temperature, maintaining the selected test bar at an approximately constant temperature helps produce more stable test results. In one embodiment of the invention, the thermo-electric cooling device maintains the temperature of the selected test bar at approximately 25° Centigrade.

FIG. 4 is a top view of a test bar in alignment with a detector and lens mechanism 50 in accordance with the present invention. The relative positions of test bar 4 and detector and lens mechanism 50 is depicted in FIG. 4. This relative positioning is exemplary. For example, the relative positions of rear light detector 42 and front light detector 44 in FIG. 4 are reverse to the relative positions of the same detectors in FIG. 3. Further, test probe 45 comprises two test arms. This embodiment provides better test probe stability than a single arm test probe. Also, the double arm test probe provides better electrical contact with the test pads than a single arm test probe.

In an exemplary embodiment of the invention, laser diodes 2 in a selected test bar 4 are tested in contiguous succession. Upon completion of the testing of a laser diode 2 in a selected test bar 4, the next contiguous laser diode 2 is tested. The order of testing may start at either end of the selected test bar 4 (For example, referring to FIG. 1B, the order of testing may start at the "aaaa" end of test bar 4 and end at the "bbbb" end, or start at the "bbbb" end and end at the "aaaa" end). When the next contiguous laser diode 2 is to be tested, test stage 18 is moved to align the light detectors 42 and 44 with the laser diode 2 to be tested. The contiguous testing of laser diodes 2 is exemplary, laser diodes 2 may be tested in any order.

Figure 5:
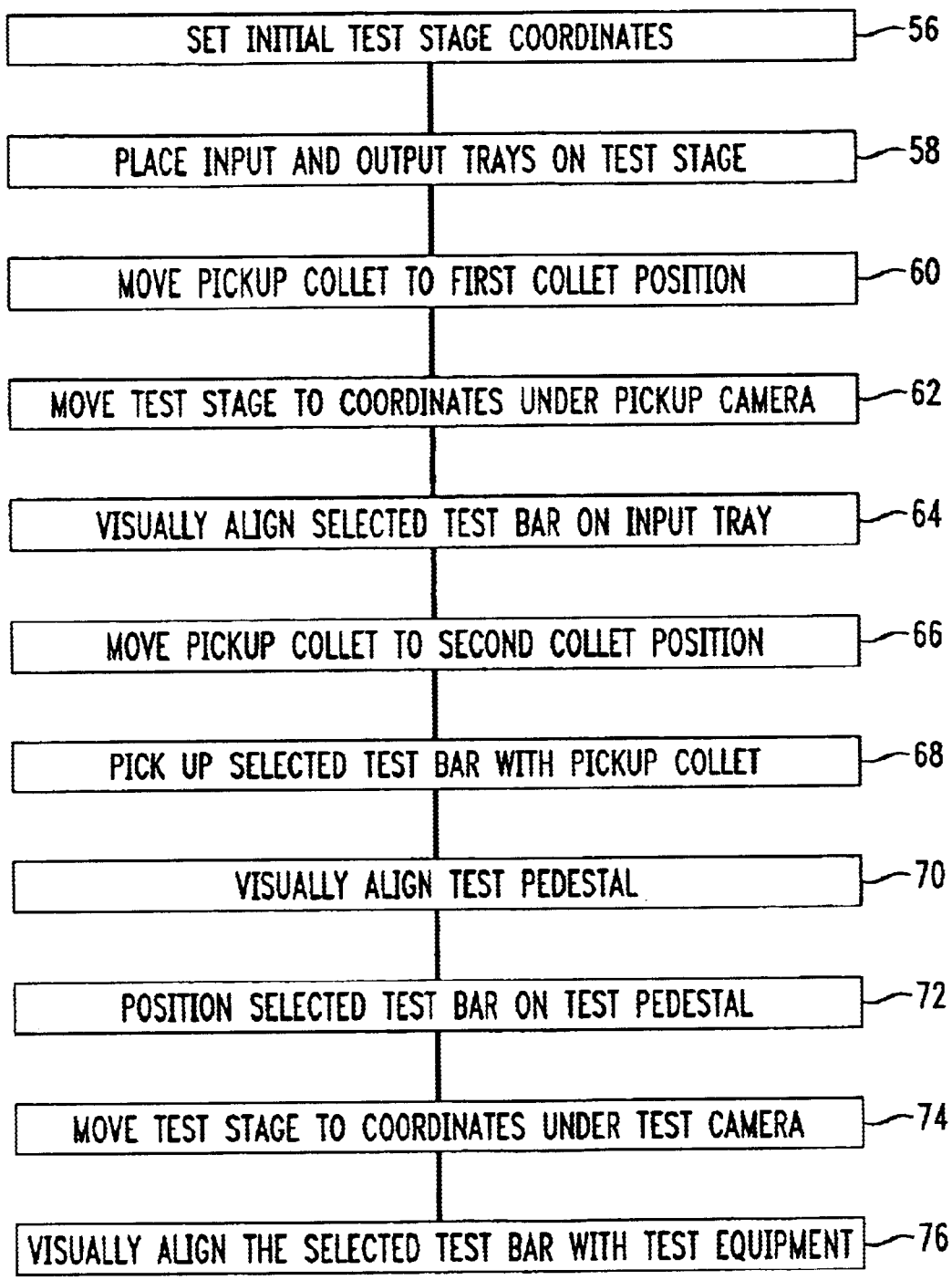
FIG. 5 is a flow diagram depicting a first portion of the testing process in accordance with the present invention.

FIG. 5 is a flow diagram depicting a first portion of the testing process in accordance with the present invention. Initially, prior to testing, coordinates corresponding to locations on test table 16 under pickup camera 26 and test camera 28 are loaded into the general purpose computer, as depicted in step 56. Also prior to testing, in step 58, trays 12 are placed on test stage 18. At least one tray 12 is placed on test stage 12. Each tray 12 contains at least one test bar 4, and each test bar 4 contains at least one circuit component 2.

In step 60, pickup collet 22 is moved to position 32 on bar transfer assembly 48, if it is not there already, in preparation for step 62. When pickup collet 22 is located at position 32 on bar transfer assembly 48, it can not obstruct an image acquired by pickup camera 26. In step 62, test stage 18 is moved to the predetermined coordinates corresponding to a location on test table 16 located under pickup camera 26. Test stage 18 is moved to align a test bar 4 (the selected test bar) to the position where it will be picked up by pickup collet 22, in step 64. This alignment is accomplished visually using images acquired by pickup camera 26 and processed by vision software resident on the general-purpose computer. Images of identification codes 6 are also acquired. Next, in step 66, pickup collet 22 is moved to position 34 on the bar transfer assembly in preparation to pick up the selected test bar 4. Pickup collet 22 is moved down to pick up the selected test bar 4, and repositioned to location 32 on bar transfer assembly 48, in step 68. Next, in step 70, test stage 18 is moved to align test pedestal 20 with pickup collet 22. This alignment is accomplished visually using images acquired by pickup camera 26 and vision software resident on the general-purpose computer. In step 72, pickup collet 22 is moved to position 34 on bar transfer assembly 48 and then moved down to position the selected test bar on the test pedestal 20. Test stage 18 is moved to predetermined coordinates corresponding to a location on test table 16 under test camera 28, in step 74. In step 76, test stage 18 is positioned to align the first laser diode 2 in the selected test bar (which is now located on test pedestal 20) with rear light detector 42 and front light detector 44. This alignment is accomplished visually with images acquired by test camera 28 and vision software resident on the general-purpose computer. Vertical alignment of the selected test bar on test pedestal 20 with rear light detector 42 and front light detector 44 is accomplished by the height of test pedestal 20 being the appropriate height to vertically align the selected test bar with the light detectors.

Figure 6:
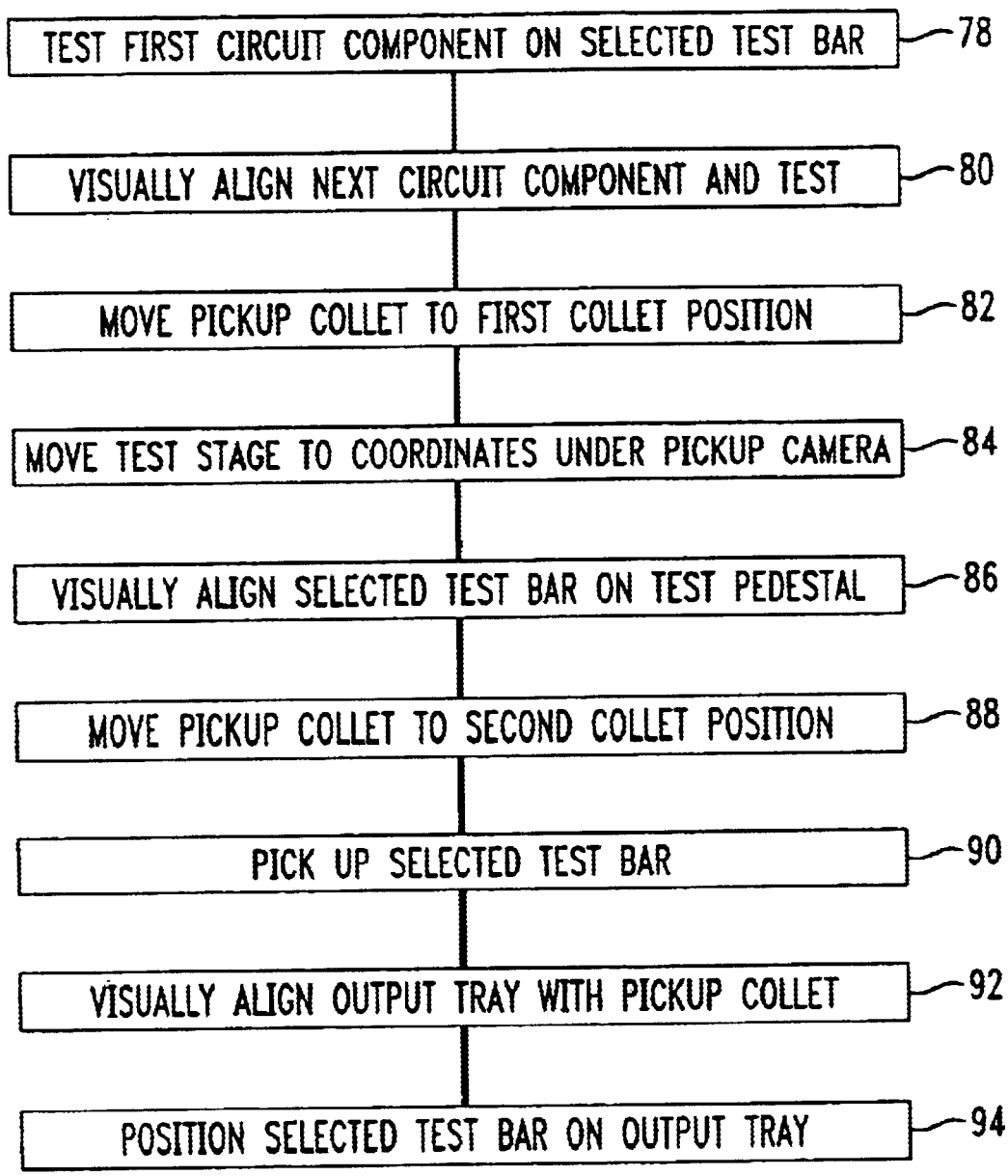
FIG. 6 is a flow diagram depicting another portion of the testing process in accordance with the present invention.

FIG. 6 is a flow diagram depicting another portion of the testing process in accordance with the present invention. Testing of the first laser diode 2 in the selected test bar is conducted in step 78. For laser diodes, these tests may include, for example, measuring light intensity, light power, and spectral content. In test fixture 30, front light detector 44 and rear light detector 42 are used to measure characteristics such as light intensity and power. Spectroscopic lens 46 is used to measure spectral content. If spectral content is to be measured during the testing procedure, detector and lens mechanism 50 is moved in the directions indicated by arrow 52 to align spectroscopic lens 46 with each laser diode 2 to be spectroscopically tested.

Once the desired tests are conducted on the first laser diode to be tested in the selected test bar, the next laser diode to be tested in the selected test bar is align and tested, in step 80. Test stage 18 is moved to align the current laser diode to be tested with light detectors 42 and 44. This alignment is accomplished visually using images acquired by test camera 28 and vision software resident on the general-purpose computer. Step 80 is repeated until all the laser diodes 2 in the selected test bar to be tested, are tested. In step 82, pickup collet 22 is moved to position 32 on bar transfer assembly 48, if it is not there already, in preparation for step 84. When pickup collet 22 is located at position 32 on bar transfer assembly 48, it can not obstruct an image acquired by pickup camera 26. In step 84, test stage 18 is moved to the predetermined coordinates corresponding to a location on test table 16 located under pickup camera 26. In step 86, test stage 18 is moved to align the selected test bar on the test pedestal 20 to the position where the selected test bar will be pickup up by pickup collet 22. This alignment is accomplished visually using images acquired by pickup camera 26 and processed by vision software resident on the general-purpose computer. Next, in step 88, pickup collet 22 is moved to position 34 on the bar transfer assembly in preparation to pick up the selected test bar from the test pedestal 20. Pickup collet 22 is moved downward and the selected test bar is picked up from the test pedestal 22, in step 90. Pickup collet 22 is then repositioned at location 32 on bar transfer assembly 48. Next, in step 92, test stage 18 is moved to align an output tray in preparation for pickup collet 22 to place the selected test bar in the output tray. This alignment is accomplished visually using images acquired by pickup camera 26 and vision software resident on the general-purpose computer. In step 94, pickup collet 22 is moved to position 34 on bar transfer assembly 48 and then moved downward to place the selected test bar in the output tray. This test process, starting with step 60, is repeated until all test bars 4 to be tested, are tested.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method for testing circuit components comprising:

moving a test stage under a first camera, wherein said test stage contains a test pedestal adapted to hold at least one test bar and at least one tray containing at least one test bar, each test bar containing at least one circuit component;

visually aligning, with said first camera, a pickup collet with a selected one of said at least one test bar;

picking up said selected test bar with said pickup collet;

visually aligning, with said first camera, said test pedestal; and positioning said selected test bar on said test pedestal;

moving said test stage under a second camera; and visually aligning, with said second camera, said selected test bar with a test site.

2. A method in accordance with claim 1, further comprising:

visually aligning, with said second camera, a selected circuit component contained in said selected test bar with said test site; and testing said selected circuit component.

3. A method in accordance with claim 2 further comprising:

subsequent to testing said selected circuit component, moving said test stage under said first camera;

visually aligning, with said first camera, said test pedestal;

picking up the selected test bar with said pickup collet;

visually aligning, with said first camera, another one of said at least one tray with said pickup collet, said another one of the at least one tray being an output tray; and positioning said selected test bar on said output tray.

4. A method in accordance with claim 1 further comprising:

positioning said pickup collet at a first collet position prior to moving said test stage under said first camera; and positioning said pickup collet at a second collet position prior to picking up said selected test bar with said pickup collet and positioning said selected test bar on said test pedestal.

5. A method in accordance with claim 1, wherein the steps of moving the test stage comprise moving the test stage to predetermined coordinates, and the steps of visually aligning comprise processing a camera image.

6. A method in accordance with claim 1, wherein said circuit components comprise optical devices.

7. A method in accordance with claim 1, wherein said at least one test bar further comprises an identification code.

8. A method in accordance with claim 7 further comprising acquiring an image, with said first camera, of said identification code.

9. A test fixture for testing circuit components, said fixture comprising:

at least one test bar, each test bar containing a plurality of circuit components;

at least one tray, each tray containing a plurality of test bars;

a test pedestal adapted to hold at least one test bar;

a transportable test stage comprising said at least one tray and said test pedestal, wherein said at least one tray and said test pedestal are in a fixed position with respect to said test stage;

a pickup collet for picking up and placing said at least one test bar;

a first camera for performing visual alignment with said pickup collet; and a second camera for visually aligning said circuit component with a test site.

10. A test fixture in accordance with claim 9, wherein said circuit components comprise optical devices.

11. A test fixture in accordance with claim 10, wherein said optical devices comprise at least one of a laser diode and a wavelength division multiplexer.

12. A test fixture in accordance with claim 9, wherein each circuit component comprises at least one test pad for making contact with test probes at said test site, the surface area of each test pad being approximately $2.5 \times 10^{-3}$ square inches.

13. A test fixture in accordance with claim 9, wherein said plurality of test bars contained by each tray is held in place by a vacuum.

14. A test fixture in accordance with claim 9, wherein said at least one test bar contained by said test pedestal is held in place by a vacuum.

15. A test fixture in accordance with claim 9, wherein said plurality of circuit components contained by each test bar is held in place by a vacuum.

16. A test fixture in accordance with claim 9, wherein said test bar is held in contact with said pickup collet by a vacuum.

17. A test fixture in accordance with claim 9, wherein said at least one test bar comprises an identification code.

18. A test fixture in accordance with claim 9, wherein said at least one tray is held in contact with said test stage by a vacuum.

19. A test fixture in accordance with claim 9, wherein the test stage is moved to predetermined coordinates, the pickup collet is aligned with the test pedestal and each tray by processing a camera image, and said test pedestal is aligned with said test site by processing a camera image.

20. A test fixture in accordance with claim 9, wherein said test site comprises at least one of a front light detector, a rear light detector, and a spectroscopic lens.

21. A test fixture in accordance with claim 9, wherein said test pedestal comprises a cooling device for maintaining a test bar placed on said test pedestal at an approximately constant temperature.

22. A test fixture in accordance with claim 21, wherein said temperature is 25° Centigrade.

* * * * *